(12) United States Patent
Han et al.

(10) Patent No.: US 9,331,015 B2
(45) Date of Patent: May 3, 2016

(54) SEMICONDUCTOR DEVICE WITH A MULTILAYER WIRE

(71) Applicant: SAMSUNG ELECTRONICS CO., LTD., Suwon-si, Gyeonggi-do (KR)

(72) Inventors: Jung-hoon Han, Hwaseong-si (KR); Sung-jin Kim, Hwaseong-si (KR); Cheon-bae Kim, Hwaseong-si (KR); Won-chul Lee, Seongnam-si (KR); Byung-hoon Cho, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 36 days.

(21) Appl. No.: 14/103,014

(22) Filed: Dec. 11, 2013

(65) Prior Publication Data

US 2014/0159252 A1    Jun. 12, 2014

(30) Foreign Application Priority Data

Dec. 11, 2012 (KR) .......................... 10-2012-0143826

(51) Int. Cl.
*H01L 23/528* (2006.01)
*H01L 23/522* (2006.01)
*H01L 23/532* (2006.01)

(52) U.S. Cl.
CPC ........ *H01L 23/5226* (2013.01); *H01L 23/5283* (2013.01); *H01L 23/5329* (2013.01); *H01L 23/53223* (2013.01); *H01L 23/53238* (2013.01); *H01L 23/53266* (2013.01); *H01L 2924/0002* (2013.01)

(58) Field of Classification Search
CPC .............. H01L 23/538; H01L 23/5226; H01L 23/5823; H01L 23/53223; H01L 23/53238; H01L 23/53266; H01L 2924/0002
USPC ........... 257/775, 774, 773, 751, E23.168, 532
See application file for complete search history.

(56) References Cited

U.S. PATENT DOCUMENTS

| | | | |
|---|---|---|---|
| 6,307,267 B1 | 10/2001 | Wada et al. | |
| 6,383,914 B1 | 5/2002 | Yasuda | |
| 7,919,802 B2 | 4/2011 | Lin et al. | |
| 8,395,235 B2 * | 3/2013 | Tsuchiya | 257/532 |
| 8,537,554 B1 * | 9/2013 | Hockaday | 361/713 |
| 2002/0025671 A1 | 2/2002 | Pyo | |
| 2006/0073691 A1 * | 4/2006 | Yoon et al. | 438/597 |
| 2012/0007240 A1 * | 1/2012 | Jung et al. | 257/751 |
| 2013/0161787 A1 * | 6/2013 | Kim et al. | 257/532 |
| 2013/0264638 A1 * | 10/2013 | Jang et al. | 257/334 |

FOREIGN PATENT DOCUMENTS

| | | |
|---|---|---|
| KR | 10-2001-0063722 A | 7/2001 |
| KR | 10-2009-0000322 A | 1/2009 |
| WO | WO 2008/029956 A | 3/2008 |

* cited by examiner

*Primary Examiner* — Alexander Oscar Williams
(74) *Attorney, Agent, or Firm* — Lee & Morse, P.C.

(57) ABSTRACT

A semiconductor device includes a semiconductor structure having a first wire extending in a first direction, an intermetallic insulating layer covering the semiconductor structure, a via structure penetrating the intermetallic insulating layer, and a second wire extending on the intermetallic insulating layer in a second direction at a predetermined angle with respect to the first direction, the second wire being connected to the first wire through the via structure and including first and second portions on each other, and a protruding portion protruding from at least one of the first and second portions, the protruding portion being at a boundary of the first and second portions.

18 Claims, 11 Drawing Sheets

SEMICONDUCTOR DEVICE WITH A MULTILAYER WIRE

CROSS-REFERENCE TO RELATED APPLICATION

Korean Patent Application No. 10-2012-0143826, filed on Dec. 11, 2012, in the Korean Intellectual Property Office, and entitled: "Semiconductor Device," is incorporated by reference herein in its entirety.

BACKGROUND

1. Field

Embodiments relate to a semiconductor device, and more particularly, to a semiconductor device including a multilayer wire.

2. Description of the Related Art

As the demand for high integration of semiconductor devices has increased, a stack structure and a multilayer wiring structure have been used to manufacture semiconductor devices. Recently, as a design rule has been reduced, the widths and pitches of wires and the vertical intervals between multilayer wires of semiconductor devices have been further reduced.

SUMMARY

Embodiments provide a semiconductor device including a wiring structure with improved operational performance and reliability.

According to embodiments, there is provided a semiconductor device including a semiconductor structure having a first wire extending in a first direction, an intermetallic insulating layer covering the semiconductor structure, a via structure penetrating the intermetallic insulating layer, and a second wire extending on the intermetallic insulating layer in a second direction at a predetermined angle with respect to the first direction, the second wire being connected to the first wire through the via structure and including first and second portions on each other, and a protruding portion protruding from at least one of the first and second portions, the protruding portion being at a boundary of the first and second portions.

Outer sidewalls of the first and second portions may be slanted in different directions with respect to the protruding portion.

Outer sidewalls of the first and second portions may meet at the boundary of the first and second portions.

Outer sidewalls of the first and second portions may not meet at the boundary of the first and second portions.

The protruding portion may protrude from the outer sidewall of the first portion.

The protruding portion may protrude from the outer sidewall of the second portion.

The protruding portion may include a first protrusion protruding from the outer sidewall of the first portion and a second protrusion protruding from the outer sidewall of the second portion, the first and second protrusions being on opposite sides of the second wire.

The first and second portions may be integral with each other and include a same material.

The first portion may include a barrier layer on an outer sidewall and a lower side thereof.

A thickness of the first portion in a third direction perpendicular to the first and second directions may be less than that of the second portion in the third direction.

The semiconductor may further include a second insulating layer adjacent to the second wire, the second insulating layer including a first layer surrounding an outer sidewall of the first portion and a second layer surrounding an outer sidewall of the second portion.

The first layer and second layer may include different materials.

According to embodiments, there is also provided a semiconductor device including a wire having a line form and extending in a horizontal direction on a semiconductor structure, the wire having a second portion on a first portion, and a protruding portion protruding from at least one of the first and second portions at a boundary of the first and second portions, and a barrier layer surrounding an outer sidewall and a lower side of the first portion of the wire.

The barrier layer and an outer sidewall of the second portion are slanted in different directions with respect to the protruding portion.

The first and second portions may be integral with each other and include a same material.

According to embodiments, there is also provided a semiconductor device including a semiconductor structure having a first wire extending in a first direction, an intermetallic insulating layer covering the semiconductor structure, a via structure penetrating the intermetallic insulating layer, and a second wire extending on the intermetallic insulating layer in a second direction at a predetermined angle with respect to the first direction, the second wire being connected to the first wire through the via structure and including first and second portions on each other, the first and second portions including a same material, and a protruding portion protruding from a widest portion of a sidewall of at least one of the first and second portions, the protruding portion including a same material as the first and second portions.

The at least one of the first and second portions with the protruding portion may be wider than the other one of the first and second portions by at least one width of the protruding portion.

The first and second portions may be asymmetric with respect to an imaginary line separating the first and second portions.

The semiconductor device may further include an insulating layer on the intermetallic insulating layer, the second wire being embedded within the insulating layer, and the insulating layer including two different material layers corresponding to the first and second portions of the second wire.

The protruding portion may include a horizontal surface parallel to the semiconductor structure and overlapping the insulating layer.

BRIEF DESCRIPTION OF THE DRAWINGS

Exemplary embodiments will be more clearly understood from the following detailed description taken in conjunction with the accompanying drawings, in which.

DETAILED DESCRIPTION

Hereinafter, embodiments will be described in more detail with reference to the accompanying drawings. The embodiments may, however, be embodied in many different forms and should not be construed as being limited to those set forth herein; rather, these embodiments are provided so that this disclosure will be thorough and complete, and will fully convey the concept of the invention to those skilled in the art. Like reference numerals refer to like elements, and overlapping descriptions will be omitted.

Also, though terms like "first" and "second" are used to describe various members, components, regions, layers, and/or portions in various embodiments, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment can be referred to as a second member, a second component, a second region, a second layer, or a second portion in another embodiment. For example, a first component may be referred to as a second component and vice versa without departing from the scope of the embodiments.

Unless otherwise defined, all terms used herein include technical terms and scientific terms, and also have the same meanings that one of ordinary skill in the art commonly understands. Additionally, it should be understood that typically used terms defined in dictionaries have consistent meanings in related technical contents, and if not explicitly defined, should not be interpreted as having excessive formal meanings.

When an implementation is possible in a different way from a presented embodiment, a specific fabrication order may be different from that in the current description. For example, two continuous processes may be substantially performed at the same time or may be performed in a reverse order.

In the accompanying drawings, the forms of elements may be modified depending on manufacturing techniques and/or processes. Accordingly, embodiments should not be construed as being limited to the specific forms of elements shown in the drawings. For example, embodiments may also include changes in forms of elements resulting from the manufacturing processes.

Figure 1:
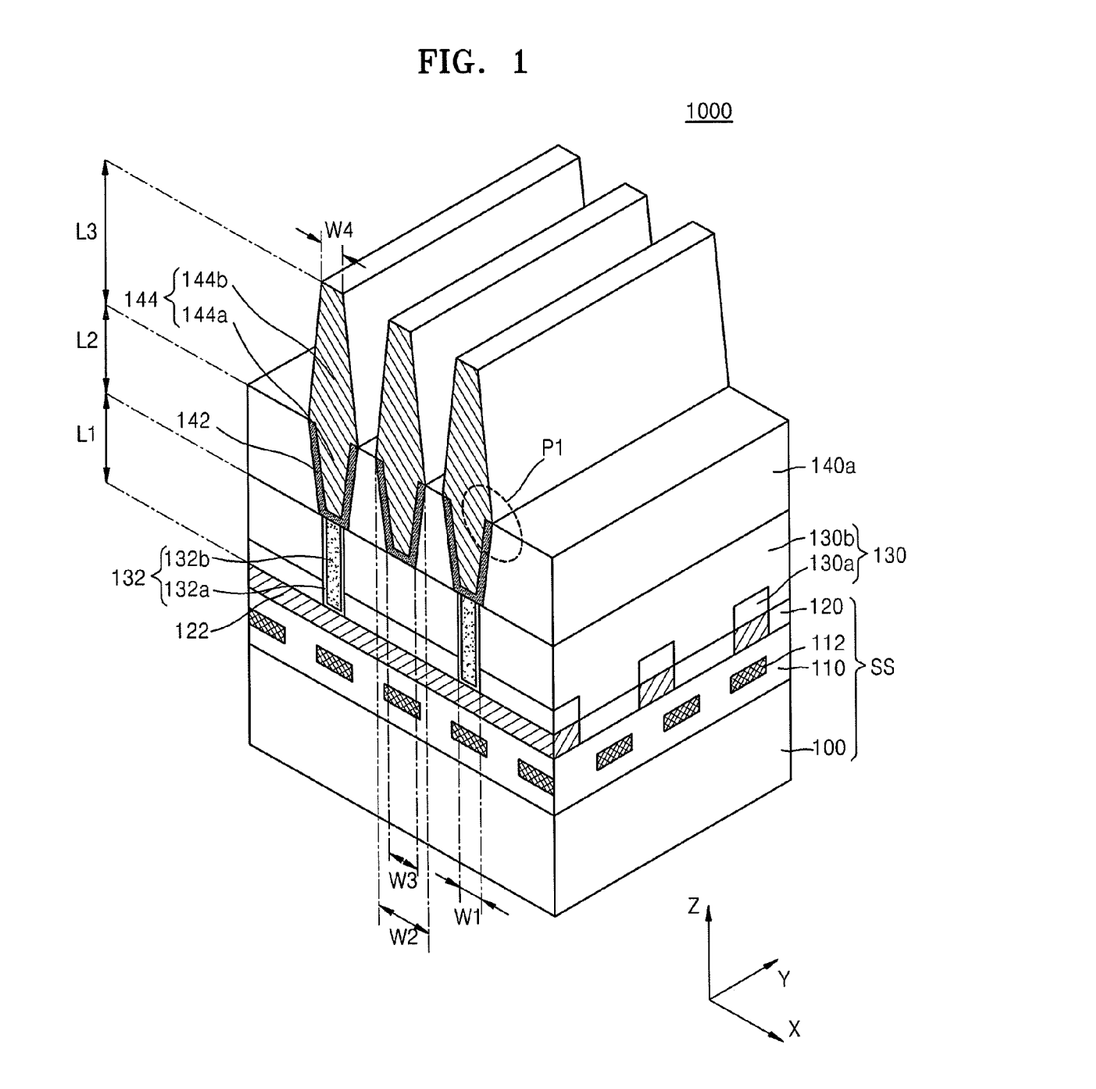
FIG. 1 illustrates a perspective view of a partial configuration of a semiconductor device according to a first embodiment.

FIG. 1 illustrates a perspective view of a partial configuration of a semiconductor device 1000 according to a first embodiment. Referring to FIG. 1, the semiconductor device 1000 may include a substrate 100, a plurality of individual devices 112, a first wire 122, a via structure 132, and a second wire 144.

The substrate 100 may be a semiconductor wafer. In one embodiment, the substrate 100 may include, e.g., silicon (Si). In another embodiment, the substrate 100 may include a semiconductor element, e.g., germanium (Ge), or a compound semiconductor, e.g., silicon carbide (SiC), gallium arsenide (GaAs), indium arsenide (InAs), and indium phosphide (InP). In one embodiment, the substrate 100 may have a silicon on insulator (SOI) structure, e.g., the substrate 100 may include a buried oxide (BOX) layer. In some embodiments, the substrate 100 may include a conductive region, e.g., a well doped with impurities or a structure doped with impurities. Additionally, the substrate 100 may have various device isolation structures, e.g., a shallow trench isolation (STI) structure.

The plurality of individual devices 112, which are of various types, and an interlayer insulating layer 110 may be disposed on the substrate 100. The plurality of individual devices 112 may be electrically connected to a conductive region (not shown) of the substrate 100. Additionally, the plurality of individual devices 112 may be electrically isolated from each other, i.e., each individual device 112 may be isolated from an adjacent individual device 112, through the interlayer insulating layer 110.

The plurality of individual devices 112 may include various microelectronic devices, e.g., metal-oxide-semiconductor field effect transistors (MOSFETs), active devices, and passive devices. For example, the plurality of individual devices 112 may include memory devices, e.g., a Dynamic RAM (DRAM) device, a Static RAM (SRAM) device, a flash memory device, a Resistive RAM (RRAM) device, a Phase RAM (PRAM) device, a Magnetic RAM (MRAM) device, or Spin-Transfer-Torque MRAM (STT-MRAM) device. In another example, the plurality of individual devices 112 may include image sensors, e.g., a CMOS imaging sensor (CIS), a large scale integrated circuit (LSI), or a micro-electro-mechanical system (MEMS).

The first wire 122 and a first insulating layer 120 may be disposed on the interlayer insulating layer 110. The first wire 122 may extend in a first direction, e.g., in an X direction. The first wire 122 may be electrically connected to the plurality of individual devices 112 and/or a conductive region of the substrate 100 through a contact plug (not shown). Additionally, the first wire 122 may be electrically isolated from adjacent other first wires through the first insulating layer 120, e.g., each first wire 122 may be electrically isolated from an adjacent first wires 122 along the Y direction through the first insulating layer 120. In some embodiments, the first wire 122 may include a metallic material, e.g., at least one of Cu, Al, W, Ti, TiN, WN, Ta, TaN, and TiAlN, and a combination thereof.

In some embodiments, the first insulating layer 120 may include, e.g., a silicon nitride and/or a silicon oxide. Selectively, the first insulating layer 120 may include boro-phospho-silicate glass (BPSG), tonen silazene (TOSZ), undoped silicate glass (USG), spin-on glass (SOG), flowable oxide (FOX), tetraethylortho silicate (TEOS), a high density plasma chemical vapor deposition (HDP CVD) oxide, or hydrogen silisesquioxane (HSQ). Moreover, although the first insulating layer 120 in FIG. 1 is formed of a single layer, embodiments are not limited thereto, e.g., the insulating layer 120 may be formed of a plurality of layers.

Hereinafter, for convenience of description, a structure including the individual device 112 and a layer including the first wire 122 from among a plurality of structures on the substrate 100 is collectively referred to as a semiconductor structure SS.

A via structure 132 and an intermetallic insulating layer 130 may be disposed on the semiconductor structure SS. The via structure 132 is interposed between the first wire 122 on the semiconductor structure SS and a second wire 144 described later, so that it may electrically connect the first wire 122 and the second wire 144 vertically. The via structure 132 may have a first thickness L1 in a third direction, e.g., in a Z direction, vertical to the substrate 100. A cross-section perpendicular to the third direction of the via structure 132 may have, e.g., a circular form, an oval form, or a polygonal form, and the width of the cross-section in the first direction may be a first width W1 in the first direction.

The via structure 132 may include a via plug 132b penetrating the intermetallic insulating layer 132, and a via barrier layer 132a surrounding the outer sidewall and bottom of the via plug 132b and penetrating the intermetallic insulating layer 130. The via plug 132b may include a conductive material, e.g., Al, Cu, Al—Cu, WSi, TiW, Ta, Mo, W, or a combination thereof. The via barrier layer 132a may be formed of a conductive layer, e.g., a single layer or a multilayer including at least one of W, WN, Ti, TiN, Ta, TaN, and Ru. The via barrier layer 132a may have a cylindrical form and a roughly uniform thickness along the outer sidewall of the via plug 132b, but is not limited thereto, e.g., the via barrier layer 132a may have a varying thickness along the outer sidewall of the via plug 132b.

The intermetallic insulating layer 130 may include a first layer 130a and a second layer 130b. In some embodiments, the first layer 130a of the intermetallic insulating layer 130 may be formed of a silicon nitride layer and may serve as an etch stop layer during forming of the via structure 132. In some embodiments, the second layer 130a of the intermetallic insulating layer 130 may be formed of an oxide layer, e.g., tetra-ethyl-ortho-silicate (TEOS). Each thickness of the first layer 130a and the second layer 130b of the intermetallic insulating layer 130 may be determined according to design requirements. Moreover, although the via structure 132 includes the via barrier layer 132b as shown in FIG. 1, embodiments are not limited thereto, e.g., the via structure 132 may include only the via plug 132a.

Figure 13:
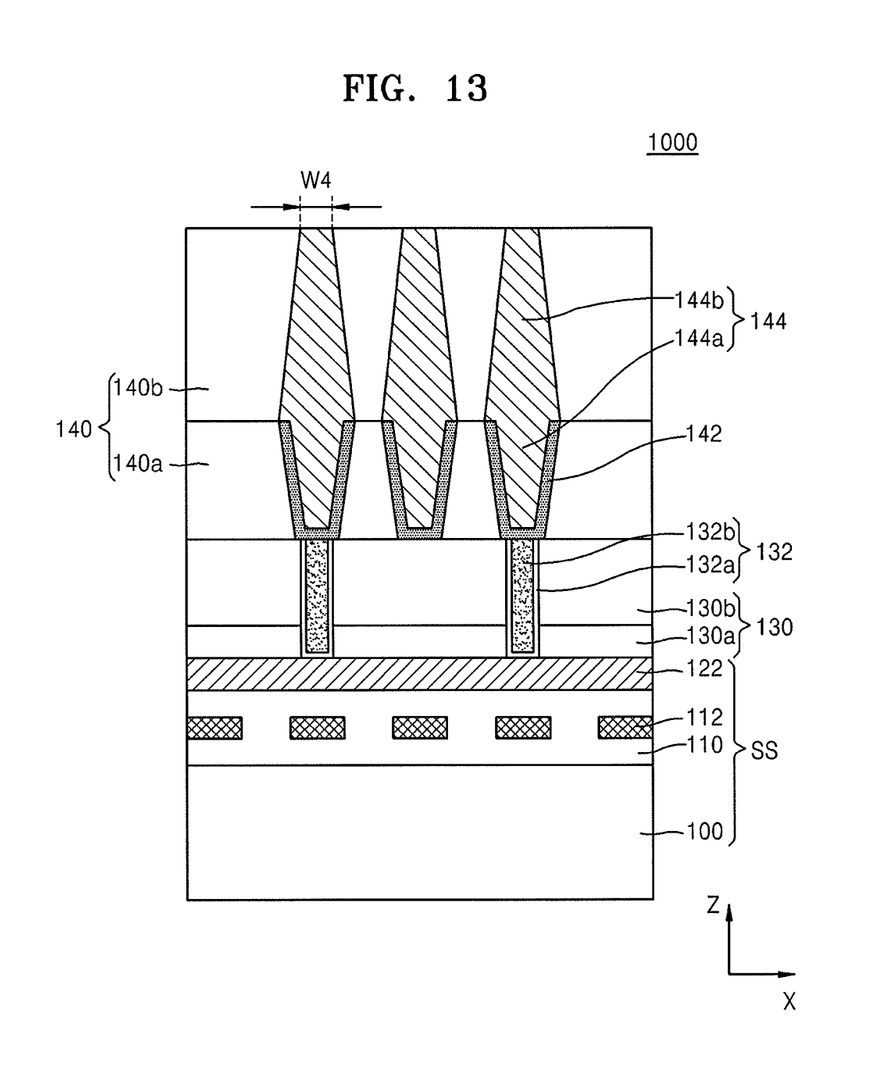

The second wire 144 and a second insulating layer 140 shown in FIG. 13 may be disposed on the via structure 132. For convenience of description, only the first layer 140a of the second insulating layer 140 is shown in FIG. 1, and a second layer 140b of the second insulating layer 140 of FIG. 13 is omitted. The same applies to FIGS. 2 to 4, 14, and 15.

The second wire 144 may be electrically connected to the first wire 122 through the via structure 132. In some embodiments, the second wire 144 may include at least one metallic material, e.g., W, Ti, TiN, WN, Ta, TaN, and TiAlN, and a combination thereof.

The second wire 144 may have a line form extending in a second direction making a predetermined angle with the first direction, e.g., along the Y direction. Although the first direction is perpendicular to the second direction as shown in FIG. 1, embodiments are not limited thereto. The second wire 144 may have a structure in which a first portion 144a and a second portion 144b on the first portion 144a are integrated. The first portion 144a may have a second thickness L2 in the third direction, and the second portion 144b may have a third thickness L3 in the third direction. The size of the second thickness L2 of the first portion 144a may be less than or equal to that of the third thickness L3 of the second portion 144b. Additionally, the size of the second thickness L2 of the first portion 144a may be less than or equal to that of the first thickness L1 of the via structure 132. However, embodiments are not limited thereto, so the first to third thicknesses L1, L2, and L3 may vary as needed.

Moreover, the outer sidewall and bottom of the first portion 144a may be surrounded by the barrier layer 142. In some embodiments, the barrier layer 132a may be formed of a single layer or a multilayer including, e.g., at least one of W, WN, Ti, TiN, Ta, TaN, and Ru. Moreover, the barrier layer 142 may be formed to have a uniform thickness on the outer sidewall and bottom of the first portion 144a, or a variable thickness.

Cross-sections perpendicular to the second direction of the first portion 144a and the second portion 144b may have different forms according to methods of forming the first and second portions 144a and 144b. In some embodiments, the cross-section of the first portion 144a along the third direction may be defined by forming a wire pattern (not shown) in a line form in the first layer 140a of the second insulating layer. That is, the cross-section of the first portion 144a along the third direction may be variously defined according to an etching process condition for forming a wire pattern in the first layer 140a of the second insulating layer. On the other hand, the cross-section of the second portion 144b along the third-direction may be defined by filling the wire pattern in the line form and then etching the second wire material layer covering the first layer 140a of the second insulating layer through a mask pattern (not shown).

Accordingly, the second wire 144 may have a portion P1 protruding from at least one of the first and second portions 144a and 144b at the boundary thereof. In some embodiments, as shown in FIG. 1, the outer sidewalls of the first and second portions 144a and 144b may be slanted with respect to the third direction, and accordingly, the protruding portion P1 may be a portion of the outer sidewalls of the first and second portions 144a and 144b. For example, the protruding portion P1 may be a horizontal portion extending along a top of the barrier layer 142 and connecting an outer sidewall of the first portion 144a with an outer sidewall of the second portion 144b, e.g., the protruding portion P1 may overlap a top surface of the barrier layer 142.

Regarding the second wire 144, at the boundary of the first and second portions 144a and 144b, the upper side of the first portion 144a and the lower side of the second portion 144b may have a same second width W2 in the first direction, a lower side of the first portion 144a may have a third width W3 smaller than the second width W2 in the first direction, and an upper side of the second portion 144b may have a fourth width W4 smaller than the second width W2 in the first direction. The relationship among the second to fourth widths W2 to W4 may be different, if necessary. Hereinbelow, for convenience of description, it is considered that the second and third widths W2 and W3 also include the thickness of the barrier layer 142.

Furthermore, although each of the cross-sections of the first and second portions 144a and 144b is vertically symmetric with respect to the third direction, as shown in FIG. 1, embodiments are not limited thereto. Thus, each of the first and the second portions 144a and 144b may have an asymmetric cross-section in the third direction.

The first layer 140a of the second insulating layer may include, e.g., a silicon nitride and a silicon oxide. Selectively, the first layer 140a of the second insulating layer may include, e.g., BPSG, TOSZ, USG, SOG, FOX, TEOS, HDP CVD oxide, or HSQ.

As shown in FIG. 1, the semiconductor device 1000 has a multilayer wiring structure, in which the first wires 122 and the second wires 144 are at different levels, e.g., at different heights relative to the substrate 100, and are electrically connected to each other through the via structure 132. Moreover, the portion P1 protruding from the boundary of the first and second portions 144a and 144b is formed, as the first and second portions 144a and 144b of the second wire 144 are defined, e.g., formed, in different ways.

In general, when a conventional multilayer wiring structure is formed, a stepped portion formed on the upper side of an align key at the same level with a via plug is used as the align key when a metallic material layer is deposited and etched for wire formation. However, due to the limitations of a process technique, it may be difficult to form the vertical thickness of the via plug to have the stepped portion of the align key with a predetermined size, e.g., less than about 4000 Å. Accordingly, the vertical thickness for forming the via plug may be limited due to a reduced design rule. Additionally, as a deposition thickness of the metallic material layer increases, it may be difficult to obtain the stepped portion of the align key.

However, according to example embodiments, the first portion 144a of the second wire 144 in the semiconductor device 1000 is defined by depositing and etching the first layer 140a of the second insulating layer, so that the limitations in obtaining the stepped portion of the align key may be overcome. This may be due to the transparency of the first layer 140a of the second insulating layer, and thus, the limitations on the vertical thickness of the via structure 132 may be overcome too. Accordingly, in the semiconductor device 1000, the vertical thickness of the second wire 144 may be increased in correspondence to the thickness of the reduced via structure 132 according to a limited design rule. Therefore, the resistance of the second wire 144 may be reduced by increasing the cross-sectional area in the first direction or the second direction in which a current flows. Additionally, in the semiconductor device 1000, an aspect ratio may be reduced during an etching process by defining only the second portion 144a of the second wire 144 through the etching process. Therefore, the occurrence of an undercut at the bottom of the second wire 144, a bridge between adjacent wirings, and a misalignment between wires and vias, e.g., as compared to conventional structures, may be prevented or substantially minimized. Accordingly, the semiconductor device 1000 may be further improved, e.g., increased operational performance stability, and high reliability thereof may be secured.

Figure 2:
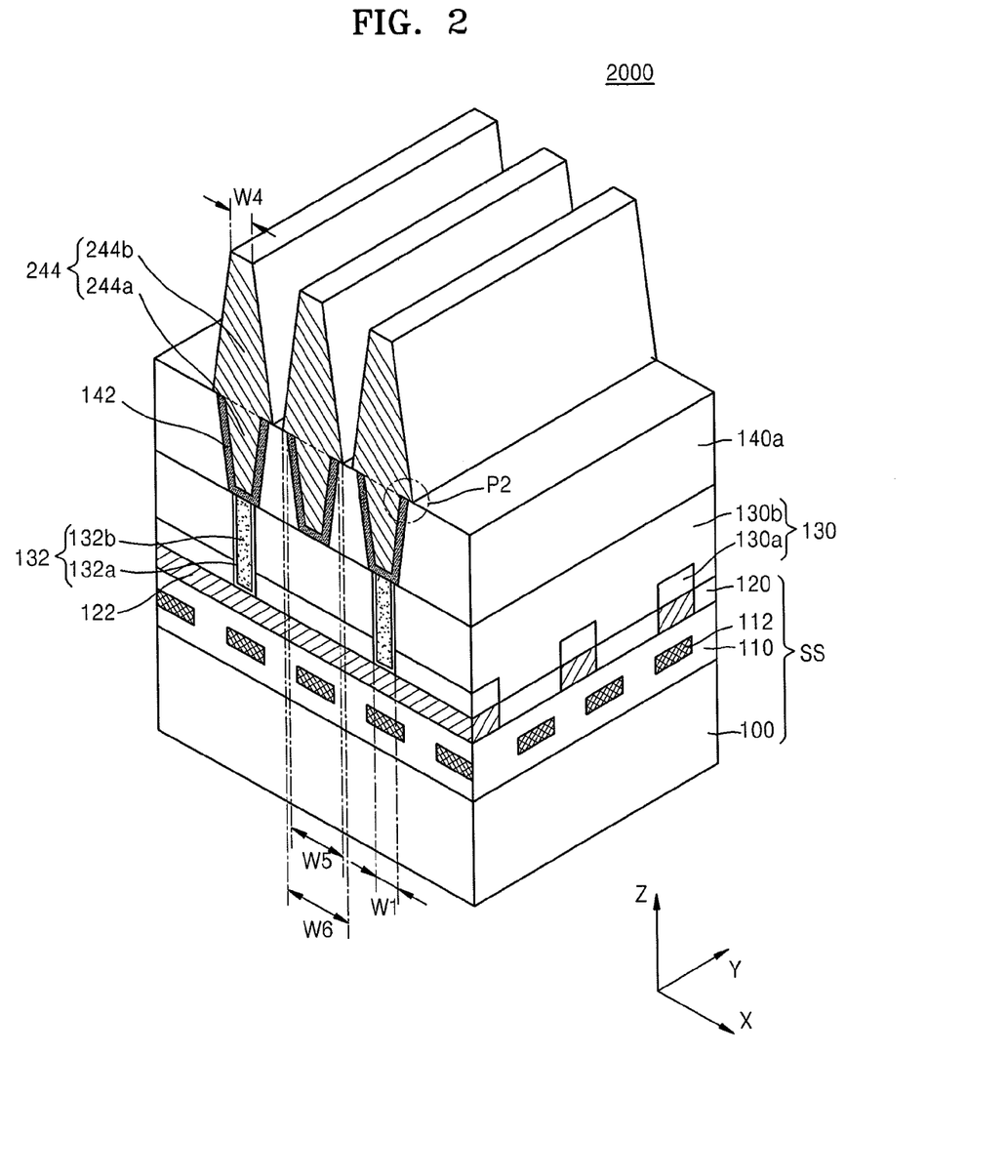
FIG. 2 illustrates a perspective view of a partial configuration of a semiconductor device according to a second embodiment.

FIG. 2 illustrates a perspective view illustrating a partial configuration of a semiconductor device 2000 according to a second embodiment. Like reference numerals refer to like elements through FIGS. 1 and 2, and accordingly, overlapping descriptions will be omitted.

Referring to FIG. 2, a second wire 244 may have a portion P2 protruding from at least one of first and second portions 244a and 244b at the boundary thereof. As shown in FIG. 2, in relation to the second wire 244, the outer sidewalls of the first and second portions 244a and 244b may not meet at the protruding portion P2. In more detail, an upper side of the first portion 244a may have a fifth width W5 in the first direction, and a lower side of the second portion 244b may have a sixth width W6 larger than the fifth width W5 in the first direction. Thus, the protruding portion P2 of the second wire 244 may be a portion of the outer sidewall of the second portion 244b. Furthermore, although each of the outer sidewalls of the first and second portions 244a and 244b is slanted with respect to the third direction, as shown in FIG. 2, embodiments are not limited thereto.

Figure 3:
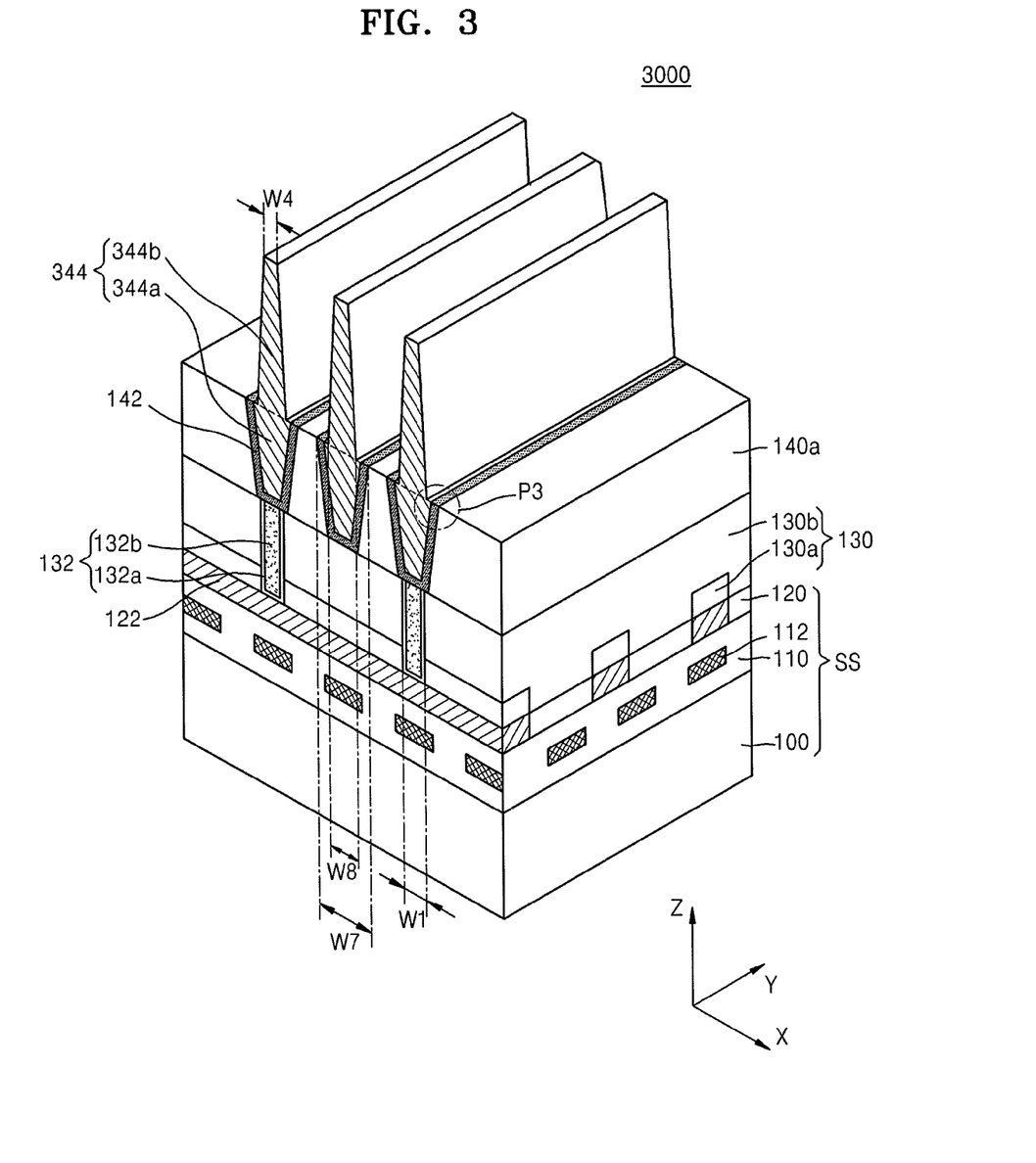
FIG. 3 illustrates a perspective view of a partial configuration of a semiconductor device according to a third embodiment.

FIG. 3 illustrates a perspective view of a partial configuration of a semiconductor device 3000 according to a third embodiment. Like reference numerals refer to like elements through FIGS. 1 to 3, and accordingly, overlapping descriptions will be omitted.

Referring to FIG. 3, a third wire 344 may have a portion P3 protruding from at least one of first and second portions 344a and 344b at the boundary thereof. As shown in FIG. 3, in relation to the second wire 344, the outer sidewalls of the first and second portions 344a and 344b may not meet at the protruding portion P3. In more detail, an upper side of the first portion 344a may have a seventh width W7 in the first direction, and a lower side of the second portion 344b may have an eighth width W8 smaller than the seventh width W7 in the first direction. Thus, the protruding portion P3 of the second wire 344 may be a portion of the outer sidewall of the first portion 344a. Furthermore, although each of the outer sidewalls of the first and second portions 344a and 344b is slanted with respect to the third direction as shown in FIG. 3, embodiments are not limited thereto.

Figure 4:
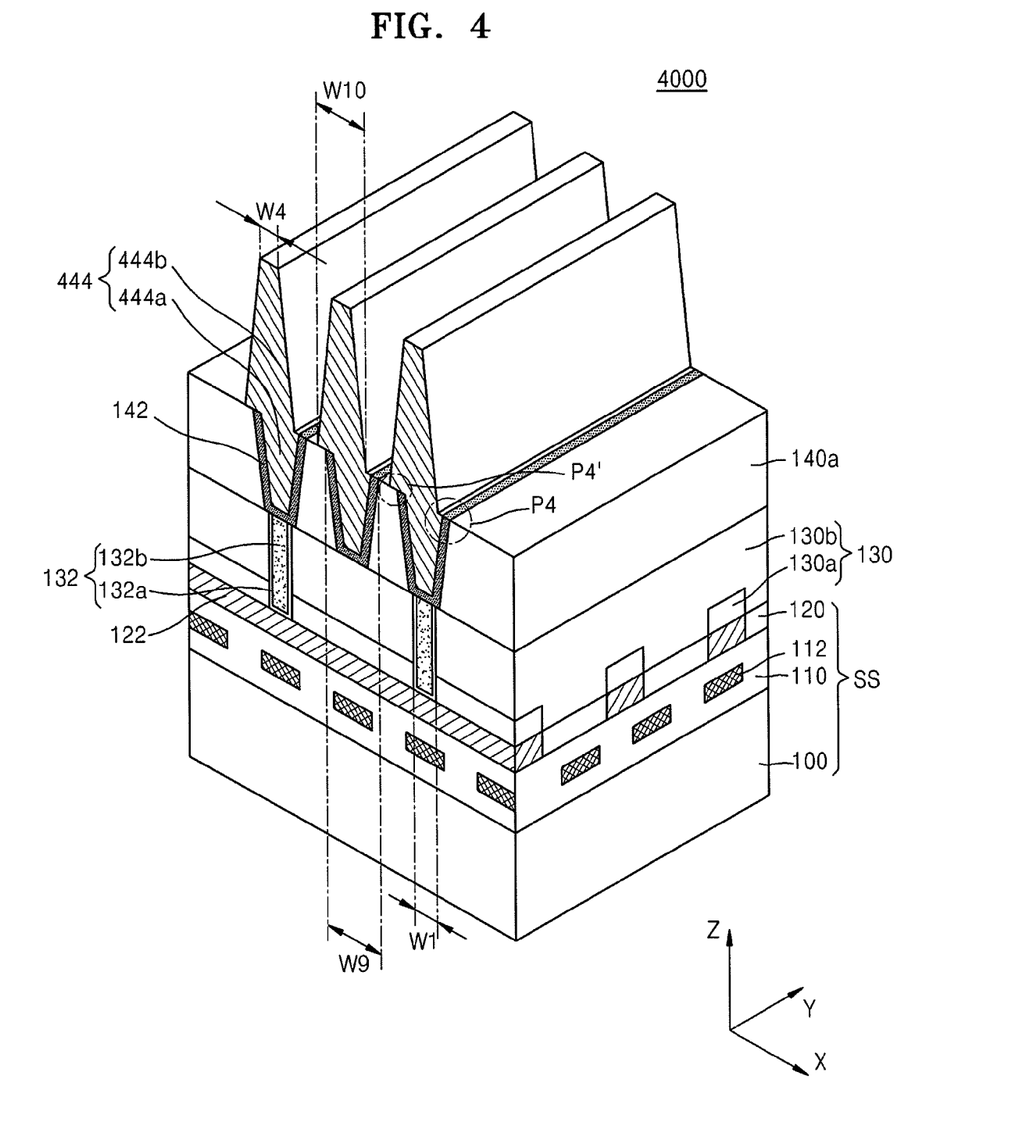
FIG. 4 illustrates a perspective view of a partial configuration of a semiconductor device according to a fourth embodiment.

FIG. 4 illustrates a perspective view of a partial configuration of a semiconductor device 4000 according to a fourth embodiment. Like reference numerals in FIGS. 1 to 4 refer to like elements, and accordingly, overlapping descriptions will be omitted.

Referring to FIG. 4, a second wire 444 may have portions P4 and P4' protruding from at least one of first and second portions 444a and 444b at the boundary thereof. The protruding portions P4 and P4' may be formed opposite each other. As shown in FIG. 4, regarding the second wire 444, the outer sidewalls of the first and second portions 444a and 444b may not meet at the protruding portions P4 and P4'. In more detail, an upper side of the first portion 444a may have a ninth width W9 in the first direction, and a lower side of the second portion 444b may have a tenth width W10 larger than the ninth width W9 in the first direction. Thus, the protruding portion P4 of the second wire 444 may be a portion of the outer sidewall of the first portion 444a, and the protruding portion P4' of the second wire 444 may be a portion of the outer sidewall of the second portion 444b. Furthermore, although each of the outer sidewalls of the first and second portions 444a and 444b is slanted with respect to the third direction on the basis of the protruding portions P4 and P4' as shown in FIG. 4, the embodiments are not limited thereto.

As shown in FIGS. 2 to 4, each of the semiconductor devices 2000, 3000, and 4000 may have various structures wherein outer sidewalls do not meet at protruding portions of a second wire. This means that a second wire may be formed to have various structures due to differences in process conditions as first and second portions of the second wire in each of the semiconductor devices 2000, 3000, and 4000 are defined through different methods. Regarding the semiconductor devices 2000, 3000, and 4000, the second wire is formed to have a specific structure like the above-mentioned semiconductor device 1000, so that performance improvement and high reliability thereof may be obtained.

FIGS. 5 to 13 illustrate cross-sectional views of stages in a method of manufacturing the semiconductor memory device 1000 according to the first embodiment. In describing FIGS. 5 to 13, a detailed description of components described previously with reference to FIG. 1 will be omitted. Additionally, embodiments are not limited to exemplified methods of manufacturing the semiconductor device 1000 described herein.

Figure 5:
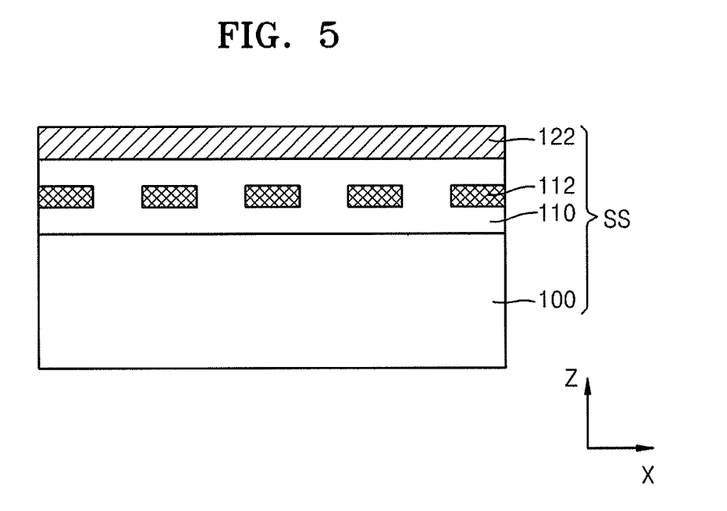
FIGS. 5 to 13 illustrate cross-sectional views of stages in a method of manufacturing a semiconductor memory device according to the first embodiment.

Referring to FIGS. 1 and 5, the plurality of individual devices 112 and the interlayer insulating layer 110 electrically insulating the plurality of individual devices 112 from each other may be formed on the substrate 100. Then, the first wires 122 extending in the first direction and the first insulating layer 120 of FIG. 1 electrically separating adjacent first wires 122 from each other may be formed on the interlayer insulating layer 110 so as to form the semiconductor structure SS. The material used for forming the first wire 122 was described above in more detail.

In some embodiments, a metallic material layer (not shown) may be formed by a chemical vapor deposition (CVD) process or by a physical vapor deposition (PVD) process. Then, the metallic material layer may be patterned through a photolithography process, so as to form the first wire 122. In another embodiment, if Cu is used for the first wire 122, a damascene or dual damascene process may be performed.

Figure 6:
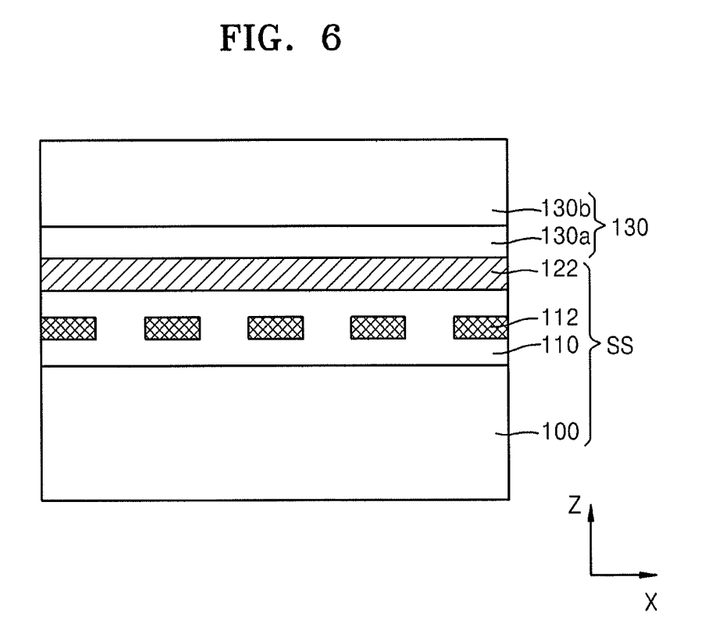

Referring to FIGS. 1 and 6, the intermetallic insulating layer 130 may be formed by sequentially depositing the first layer 130a and the second layer 130b on the semiconductor structure SS. In order to form the first layer 130a and the second layer 130b of the intermetallic insulating layer 130, a CVD process and/or a PVD process, e.g., sputtering, may be performed. In some embodiments, the first layer 130a of the intermetallic insulating layer 130 may be formed to have a thickness of about 300 Å to about 1300 Å, and the second layer 130b of the intermetallic insulating layer 130 may be formed to have a thickness of about 1000 Å to about 4000 Å. The material used for the first and second layers 130a and 130b of the intermetallic insulating layer 130 was described above in more detail.

Figure 7:
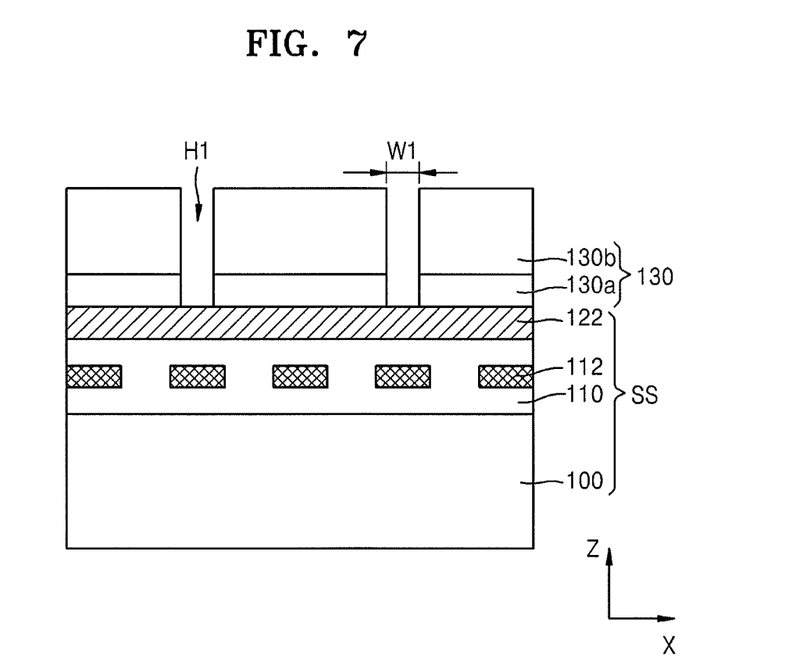

Referring to FIGS. 1 and 7, a first hole H1 for forming the via structure 132 of FIG. 1 may be formed by etching and penetrating the first and second layers 130a and 130b of the intermetallic insulating layer 130 through a mask pattern (not shown) as an etching mask. In order to form the first hole H1, an anisotropic etching process or a laser drilling technique may be used. For example, when the first hole H1 is formed using an etching process, the second layer 130b may be etched by using the first layer 130a of the intermetallic insulating layer 130 as an etch stop layer, followed by sequentially etching the first layer 130a to finalize the first hole H1. In some embodiments, the first hole H1 may be formed to have the first width W1 in the intermetallic insulating layer 130. After the first hole H1 is formed, the mask pattern is removed to expose the upper side of the second layer 130b of the intermetallic insulating layer 130. The mask pattern may be formed of a photoresist material.

Figure 8:
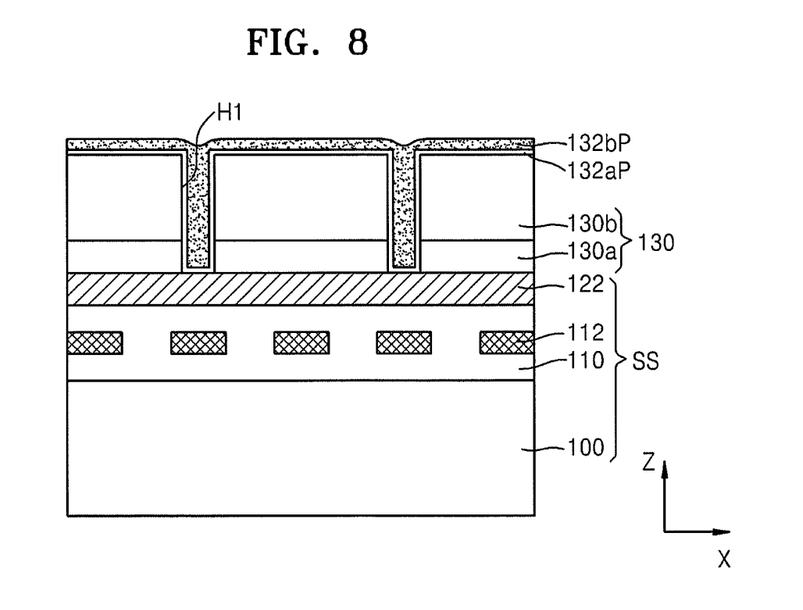

Referring to FIG. 8, a via barrier material layer 132ap may be formed to, e.g., conformally, cover the inner sidewall and lower side of the first hole H1, and a via plug material layer 132bp may be formed on the via barrier material layer 132ap. The via barrier material layer 132ap may be formed of the same material as the via barrier 132a and the via plug material layer 132bp may be formed of the same material as the via plug 132b. The via barrier material layer 132ap and the via plug material layer 132bp may be deposited through a CVD, PVD, or ALD method.

Figure 9:
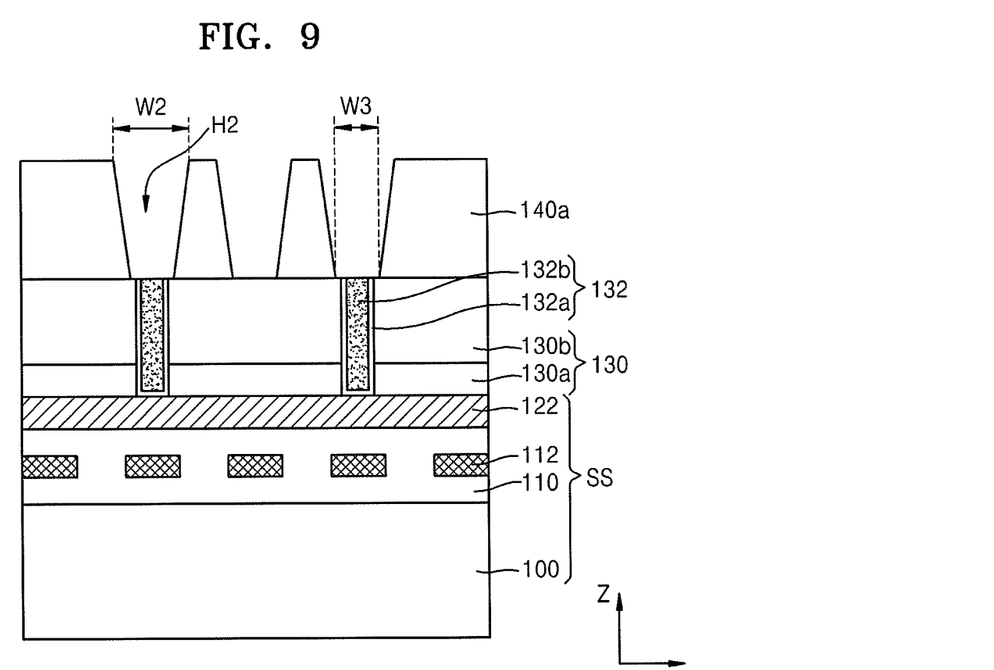

Referring to FIG. 9, the via barrier material layer 132ap and the via plug material layer 132bp covering the inner sidewall and lower side of the first hole H1, as well as the upper side of the second layer 130b of the intermetallic insulating layer 130, may be planarized through a CMP process or an etch back process, so that the via structure 132 including the via plug 132b and the cylindrical via barrier layer 132a surrounding the via structure 132 may be formed.

Then, the first layer 140a of the second insulating layer 140 (FIG. 13) may be formed to cover the upper sides of the via structure 132 and the second layer 130b of the intermetallic insulating layer 130. A wire pattern hole H2 of a line form may be formed in the first layer 140a of the second insulating layer 140 by using a mask pattern (not shown) as an etching mask, e.g., the wire pattern hole H2 may extend along the Y direction and may have a depth along the z direction. As illustrated in FIG. 9, a bottom of the wire pattern hole H2 exposes a top surface of the via structure 132, e.g., the bottom of the wire pattern hole H2 exposes entire top surfaces of the via barrier 132a and via plug 132b. Accordingly, a lower portion of a second wire described below, i.e., a first portion, may be defined.

The first layer 140a of the second insulating layer 140 may include, e.g., an oxide layer or a nitride layer. Due to the transparency of the oxide layer or the nitride layer, the necessity of obtaining a stepped portion of an align key formed at the same level as the via structure 132 in order to align the via structure 132 and the second wire 144 of FIG. 1 is reduced. Accordingly, when forming the above-mentioned via structure 132, the limitations on the thickness in the third direction of the via structure 132 may be overcome. That is, the thickness in the third direction of the via structure 132 may be reduced, and the thickness in the third direction of the second wire 144 may be increased.

According to the conditions and characteristics of the etching process for forming the wire pattern hole H2 in the line form, the upper side of the wire pattern hole H2 of the line form may be formed to have the second width W2 in the first direction, and the lower side, i.e., the bottom, of the wire pattern hole H2 in the line form may be formed to have the third width W3 in the first direction. In some embodiments, the size of the second width W2 may be greater than that of the third width W3 in the first direction, and accordingly, the wire pattern hole H2 of the line form may have an inner sidewall slanted from top to bottom. The first layer 140a of the second insulating layer 140 may be formed to have a thickness of about 1000 Å to about 3000 Å, i.e., a depth of the wire pattern hole H2 may be about 1000 Å to about 3000 Å.

Figure 10:
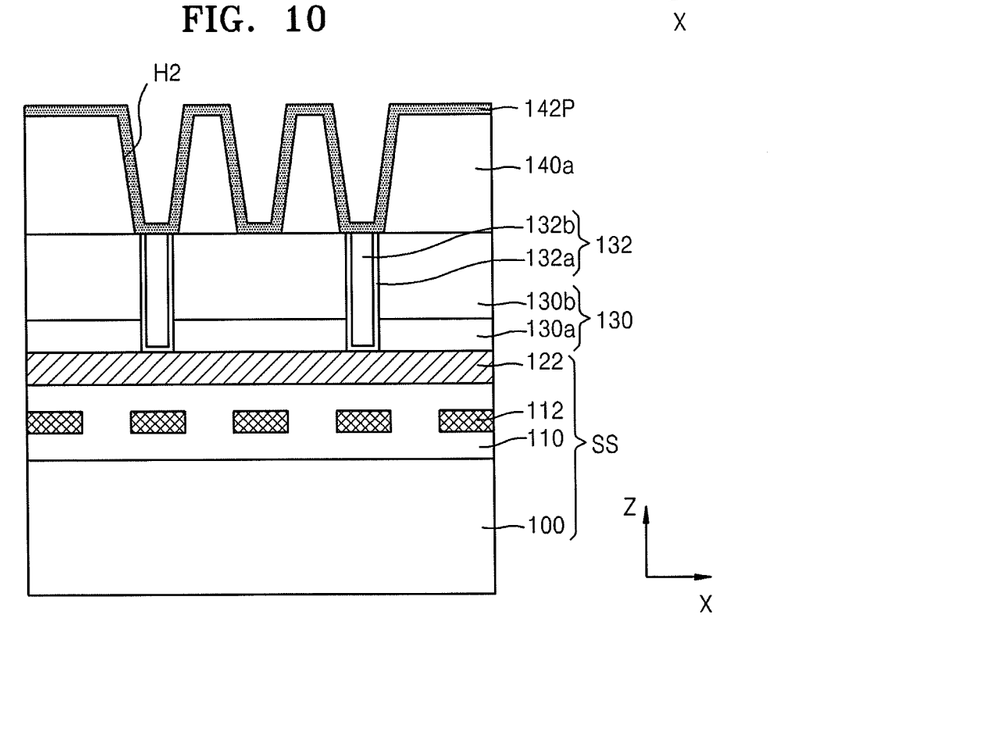

Referring to FIG. 10, a barrier material layer 142p may be formed, e.g., conformally, to cover the inner sidewall and lower side, i.e., bottom, of the wire pattern hole H2 and the upper side, i.e., surface, of the first layer 140a of the second insulating layer 140. The barrier material layer 142p may be formed to have a thickness of about 100 Å to about 500 Å through a CVD, PVD, or ALD process.

Figure 11:
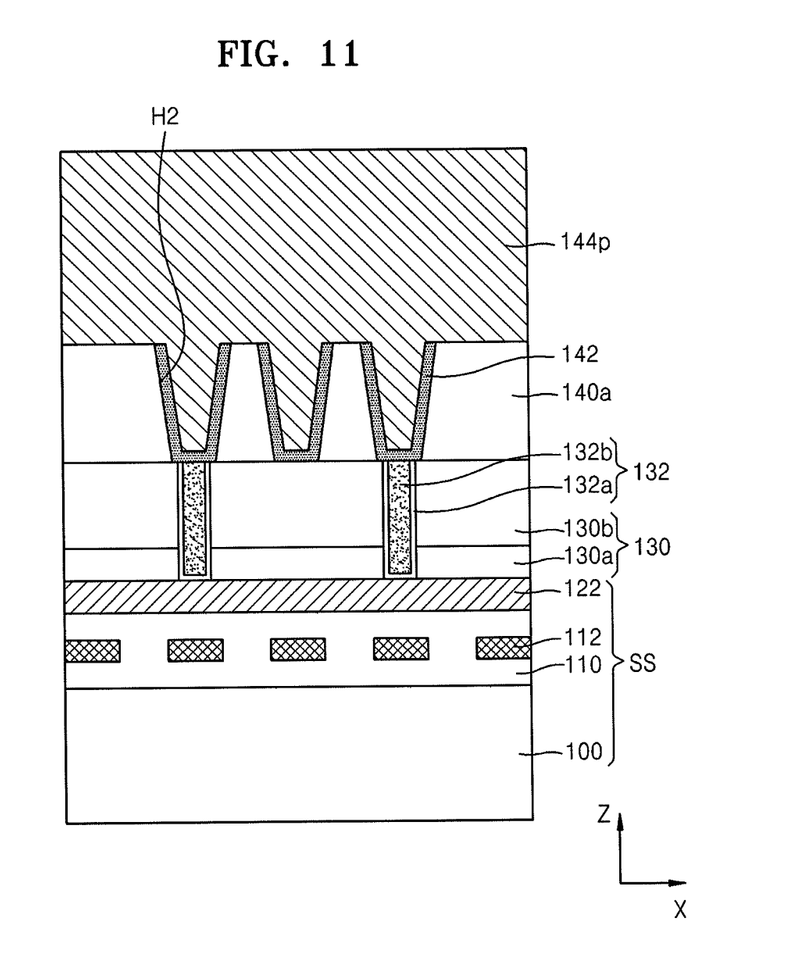

Referring to FIG. 11, a second wire material layer 144p may be formed to cover the barrier material layer 142p and fill the wire pattern hole H2. The second wire material layer 144p may be formed through a CVD or PVD process.

In the limited design rule described above, the thickness of the second wire material layer 144p may increase in accordance with a decreased thickness in the third direction of the via structure 132. Thus, the resistance of the second wire 144 formed through a subsequent process may be reduced. Moreover, a barrier material layer (not shown) formed of the same material as or different material than the barrier material layer 142p may be further formed on the second wire material layer 144p.

Figure 12:
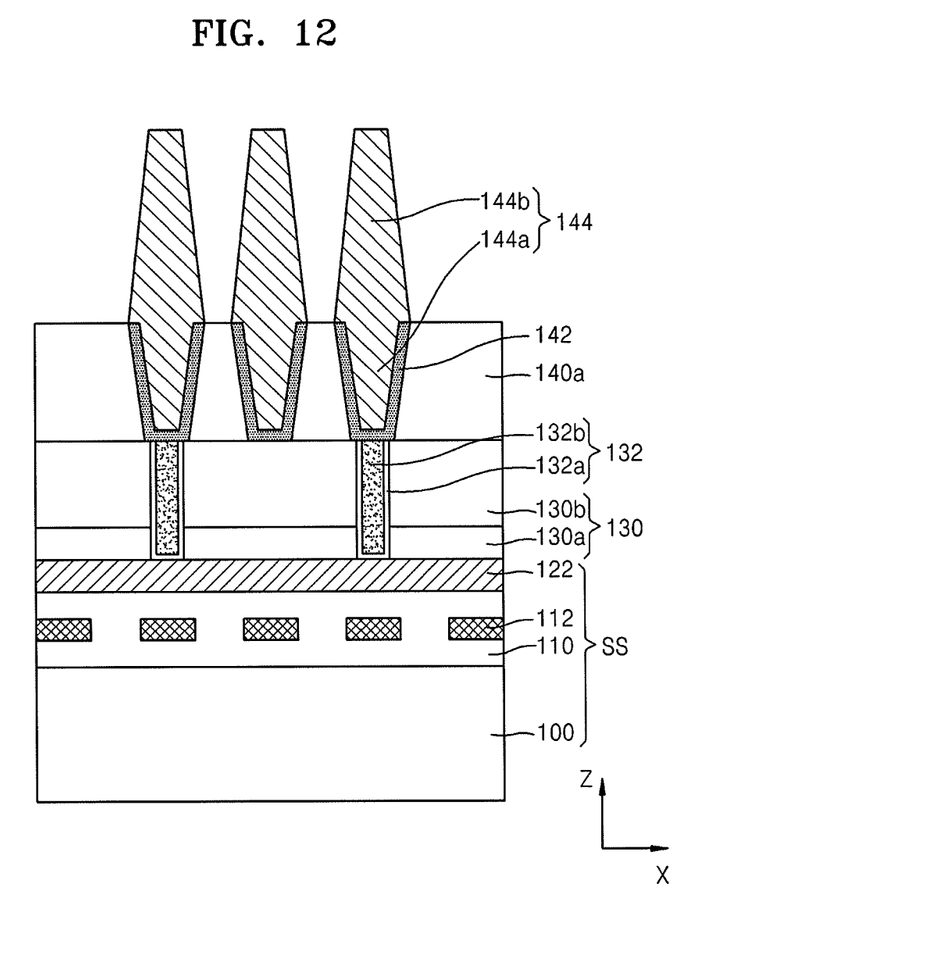

Referring to FIG. 12, the second wire 144 may be formed by removing portions of the second wire material layer 144p and the barrier material layer 142p from regions other than those corresponding to the position of the wire pattern hole H2 through a mask pattern (not shown) as an etching mask. For example, as illustrated in FIG. 12, portions of the second wire material layer 144p may be removed, such that the second wire material layer 144p may remain in the wire pattern hole H2 and may extend vertically in an upward direction from the wire pattern hole H2 only in a region overlapping the wire pattern hole H2 and the barrier layer 142. As such, the portion of the wire material layer 144p within the wire pattern hole H2 may define the first portion 144a of the second wire 144, and the portion of the wire material layer 144p above the wire pattern hole H2 may define the second portion 144b of the second wire 144. For example, an upper portion of the second wire 144, i.e., the second portion 144b, may be defined in this way, and a lower portion of the second wire 144, i.e., the first portion 144a, may be surrounded by the barrier layer 142. Thus, since only the second portion 144b of the second wire 144 is defined in the etching process using the mask pattern, an aspect ratio may be reduced during the etching process. Therefore, defects such as undercut and bridge in the second wire 144 may be prevented.

Depending on the conditions of the etching process using the mask pattern, the second portion 144b of the second wire 144 may have an outer sidewall inversely slanted with respect to the outer sidewall of the first portion 144a. Accordingly, the second wire 144 may have a portion protruding from at least one of the first and second portions 144a and 144b at the boundary thereof. Moreover, the second wire 144 may have various protruding portions like the second wire of the semiconductor devices 2000, 3000, and 4000 shown in FIGS. 2 to 4.

Referring to FIG. 13, the second layer 140b of the second insulating layer 140 may be formed to cover the upper side of the first layer 140a of the second insulating layer 140 and to surround the second portion 144b of the second wire 144. For example, the second layer 140b of the second insulating layer 140 may fill gaps between adjacent second portions 144b of the second wire 144. In addition, the first layer 140a corresponds to a portion for forming a wire pattern hole, and the second layer 140b corresponds to a portion filling a gap between the second portions 144b of the second wire 144. The second layer 140b may be formed of a same material or a different material relative to the first layer 140a.

Regarding the semiconductor device 1000, when the second wire 144 electrically connected to the first wire 122 through the via structure 132 is formed through the above manufacturing method, the thickness of the via structure 132 along the Z direction is reduced and the thickness of the second wire 144 along the Z direction is increased in the limited design rule. Therefore, performance improvement and high reliability of the semiconductor device 1000 may be obtained.

Figure 14:
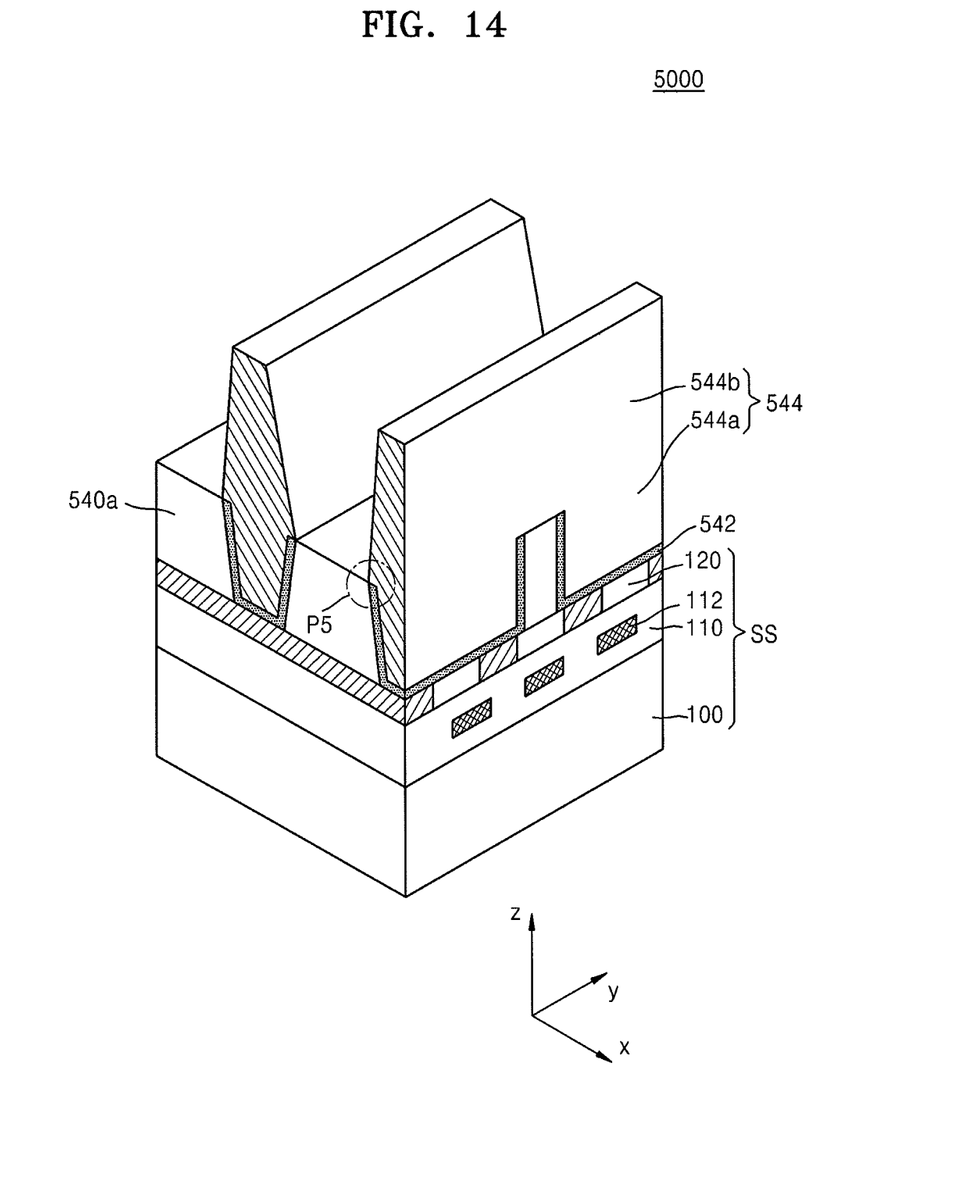
FIG. 14 illustrates a perspective view of a partial configuration of a semiconductor device according to a fifth embodiment.

FIG. 14 illustrates a perspective view of a partial configuration of a semiconductor device 5000 according to a fifth embodiment. Like reference numerals in FIGS. 1 and 14 refer to like elements, and accordingly, overlapping descriptions will be omitted.

Referring to FIG. 14, regarding the semiconductor device 5000, a second wire 544 may be disposed on the semiconductor structure SS having the first wire 122 thereon. For example, a first portion 544a of the second wire 544 may extend in the second direction on the semiconductor structure SS but may have a discontinuous line form, and a second portion 544b of the second wire 544 may have a line form continuously extending in the second direction. That is, the first portion 544a of the second wire 544 is node-separated by each first wire 122 that needs to be electrically connected according to a wire layout of the semiconductor device 5000, so that it has a discontinuous line form. Although the first portion 544a of the second wire 544 has a discontinuous line form at an interval between two first wires to be connected to adjacent first wires as shown in FIG. 14, embodiments are not limited thereto. Thus, the first portion 544a of the second wire 544 may have a line form that discontinues at various intervals according to a wire layout of the semiconductor device 5000.

Moreover, the second wire 544 may have a portion P5 protruding from at least one of the first and second portions 544a and 544b at the boundary thereof. In relation to the second wire 544, outer sidewalls of the first and second portions 544a and 544b may meet at the protruding portion P5. However, embodiments are not limited thereto, e.g., the outer sidewalls of the first and second portions 544a and 544b may be configured as described previously in FIGS. 2-4 without meeting at the protruding portion P5.

In relation to the semiconductor device 5000, since the thickness in a vertical direction of the second wire 544 is increased by omitting the via structure for a vertical electrical connection of a multilayer wire due to a limited design rule, the resistance of the second wire 544 may be reduced by increasing the cross-sectional area in a direction in which a current flows. Additionally, unlike an existing etching process to define all portions of a wire, only the second portion 544b of the second wire 544 is defined by an etching process so as to reduce an aspect ratio during the etching process. Therefore, the occurrence of an undercut at the bottom of the second wire 544 and a bridge defect between adjacent second wires may be prevented. Accordingly, the semiconductor device 5000 may be further improved and high reliability thereof may be secured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a semiconductor structure having a first wire extending in a first direction;
   an intermetallic insulating layer covering the semiconductor structure;
   a via structure penetrating the intermetallic insulating layer; and
   a second wire extending on the intermetallic insulating layer in a second direction at a predetermined angle with respect to the first direction, the second wire being connected to the first wire through the via structure and including:
   first and second portions on each other, and
   a protruding portion protruding from at least one of the first and second portions, the protruding portion being at a boundary of the first and second portions,
   wherein outer sidewalls of the first and second portions are inversely slanted, the outer sidewalls of the first portion extending at different oblique angles with respect to the protruding portion than the corresponding outer sidewalls of the second portion.

2. The semiconductor device as claimed in claim 1, wherein the outer sidewalls of the first and second portions meet at the boundary of the first and second portions.

3. The semiconductor device as claimed in claim 1, wherein the outer sidewalls of the first and second portions do not meet at the boundary of the first and second portions.

4. The semiconductor device as claimed in claim 3, wherein the protruding portion protrudes from the outer sidewall of the first portion.

5. The semiconductor device as claimed in claim 3, wherein the protruding portion protrudes from the outer sidewall of the second portion.

6. The semiconductor device as claimed in claim 3, wherein the protruding portion includes a first protrusion protruding from the outer sidewall of the first portion and a second protrusion protruding from the outer sidewall of the second portion, the first and second protrusions being on opposite sides of the second wire.

7. The semiconductor device as claimed in claim 1, wherein the first and second portions are integral with each other and include a same material.

8. The semiconductor device as claimed in claim 1, wherein the first portion includes a barrier layer on an outer sidewall and a lower side thereof.

9. The semiconductor device as claimed in claim 1, wherein a thickness of the first portion in a third direction perpendicular to the first and second directions is less than that of the second portion in the third direction, the third direction extending along a normal to a substrate of the semiconductor structure.

10. The semiconductor device as claimed in claim 1, further comprising a second insulating layer adjacent to the second wire, the second insulating layer including a first layer surrounding an outer sidewall of the first portion and a second layer surrounding an outer sidewall of the second portion.

11. The semiconductor device as claimed in claim 10, wherein the first layer and second layer include different materials.

12. A semiconductor device, comprising:
a wire having a line form and extending in a horizontal direction on a semiconductor structure, the wire including:
a second portion on a first portion, and
a protruding portion protruding from at least one of the first and second portions at a boundary of the first and second portions; and
a barrier layer surrounding an outer sidewall and a lower side of the first portion of the wire,
wherein outer sidewalls of the first and second portions are inversely slanted, the outer sidewalls of the first portion extending at different oblique angles with respect to the protruding portion than the corresponding outer sidewalls of the second portion.

13. The semiconductor device as claimed in claim 12, wherein the barrier layer and an outer sidewall of the second portion are slanted in different directions with respect to the protruding portion.

14. The semiconductor device as claimed in claim 12, wherein the first and second portions are integral with each other and include a same material.

15. A semiconductor device, comprising:
a semiconductor structure having a first wire extending in a first direction;
an intermetallic insulating layer covering the semiconductor structure;
a via structure penetrating the intermetallic insulating layer; and
a second wire extending on the intermetallic insulating layer in a second direction at a predetermined angle with respect to the first direction, the second wire being connected to the first wire through the via structure and including:
first and second portions on each other, the first and second portions including a same material, and
a protruding portion protruding from a widest portion of a sidewall of at least one of the first and second portions, the protruding portion including a same material as the first and second portions,
wherein the first and second portions are asymmetric with respect to an imaginary line separating the first and second portions.

16. The semiconductor device as claimed in claim 15, wherein the at least one of the first and second portions with the protruding portion is wider than the other one of the first and second portions by at least one width of the protruding portion.

17. The semiconductor device as claimed in claim 15, further comprising an insulating layer on the intermetallic insulating layer, the second wire being embedded within the insulating layer,
wherein the insulating layer includes:
a first insulating layer separating adjacent segments of the first portion of the second wire, and
a second insulating layer on the first insulating layer and separating adjacent segments of the second portion of the second wire, the first and second insulating layers including two different material layers.

18. The semiconductor device as claimed in claim 17, wherein the protruding portion includes a horizontal surface parallel to the semiconductor structure and overlapping the insulating layer.

* * * * *